United States Patent [19]

Ludvik et al.

[11] Patent Number: 5,065,110
[45] Date of Patent: Nov. 12, 1991

[54] FEED-FORWARD AMPLIFIER INCLUDING PHASE CORRECTION

[75] Inventors: Stephen Ludvik, Palo Alto; Victor E. Steel, Felton; Douglas Scott, Santa Clara, all of Calif.

[73] Assignee: Teledyne MEC, Mountain View, Calif.

[21] Appl. No.: 517,879

[22] Filed: May 2, 1990

[51] Int. Cl.[5] .............................................. H03F 1/26
[52] U.S. Cl. .................................... 330/149; 330/151
[58] Field of Search ................. 330/149, 151; 328/163

[56] References Cited

U.S. PATENT DOCUMENTS

| 3,541,467 | 11/1970 | Seidel | 330/124 |
|---|---|---|---|
| 3,753,140 | 8/1973 | Feistel | 330/109 |
| 3,886,470 | 5/1975 | O'Neil et al. | 330/149 |
| 4,004,253 | 1/1977 | Takesaki et al. | 333/28 R |
| 4,258,328 | 3/1981 | Prevot et al. | 330/149 |
| 4,276,514 | 1/1981 | Huane | 330/149 |
| 4,532,478 | 7/1985 | Silagi | 330/151 |
| 4,581,595 | 4/1986 | Silagi | 333/139 |
| 4,583,049 | 4/1986 | Powell | 330/149 X |
| 4,595,882 | 6/1986 | Silagi et al. | 330/151 |
| 4,629,996 | 12/1986 | Watanabe et al. | 330/151 |
| 4,779,056 | 10/1988 | Moore et al. | 330/107 |
| 4,841,179 | 6/1989 | Hajano et al. | 307/520 |

FOREIGN PATENT DOCUMENTS

| 1302605 | 4/1970 | United Kingdom . |
| 1519456 | 10/1974 | United Kingdom . |
| 2018171 | 2/1979 | United Kingdom . |

OTHER PUBLICATIONS

"Error Controlled High Power Linear Amplifiers at VHF," Seidel et al., Bell System Technical Journal, pp. 651-722, 5-6/68.

"A Microwave Feed-Forward Experiment, " H. Seidel, Bell System Technical Journal, pp. 2879-2916; 11/71.

*Primary Examiner*—James B. Mullins
*Attorney, Agent, or Firm*—Townsend and Townsend

[57] ABSTRACT

A feed-forward amplifier utilizes frequency dependent delay elements to cancel the effects of phase dispersion in the amplifier to amplify a broadband, high-frequency signal with low distortion.

5 Claims, 4 Drawing Sheets

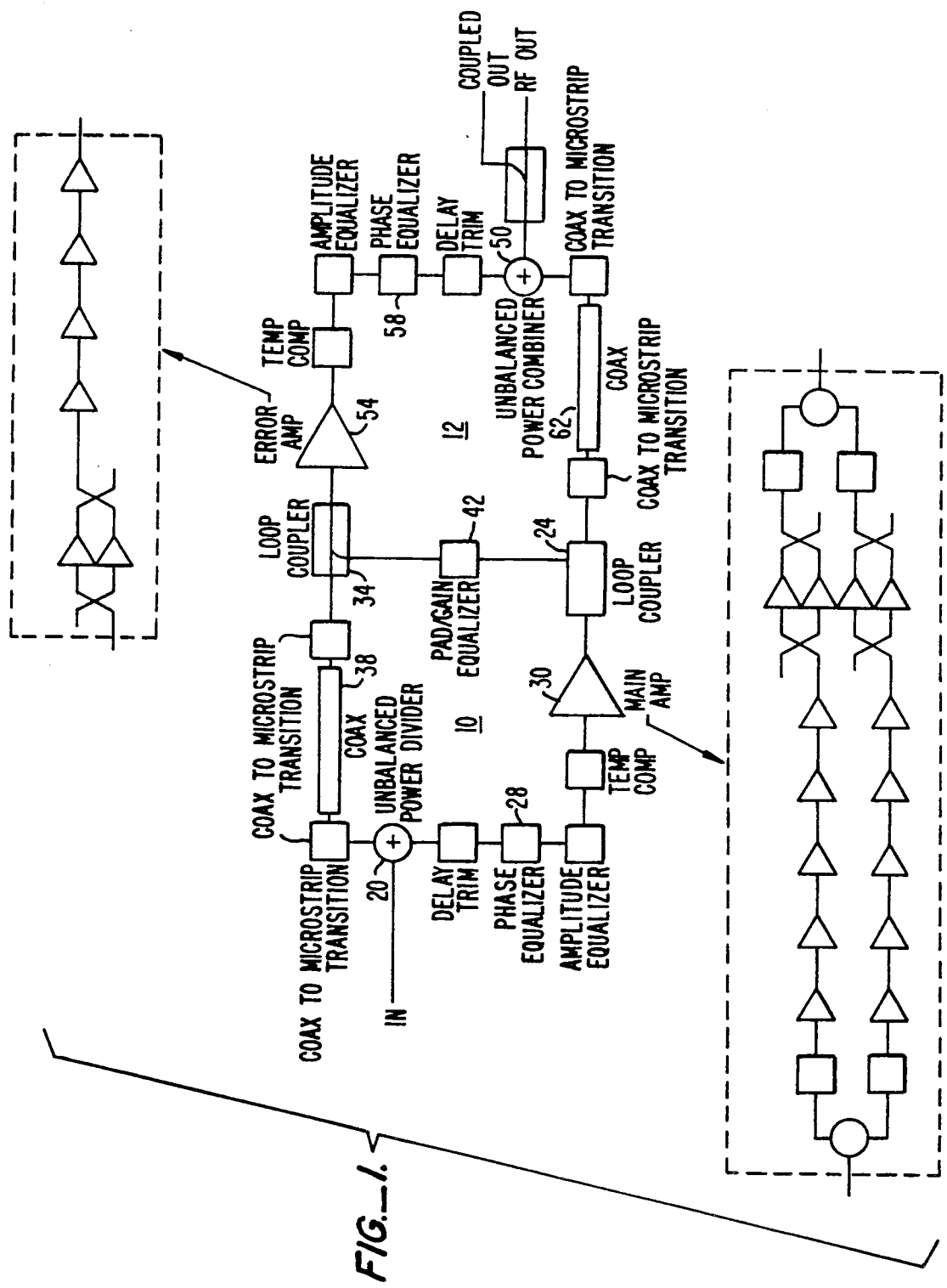
FIG._1.

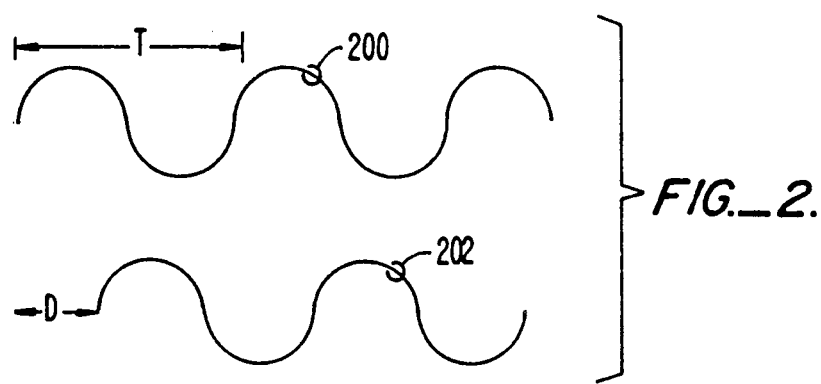
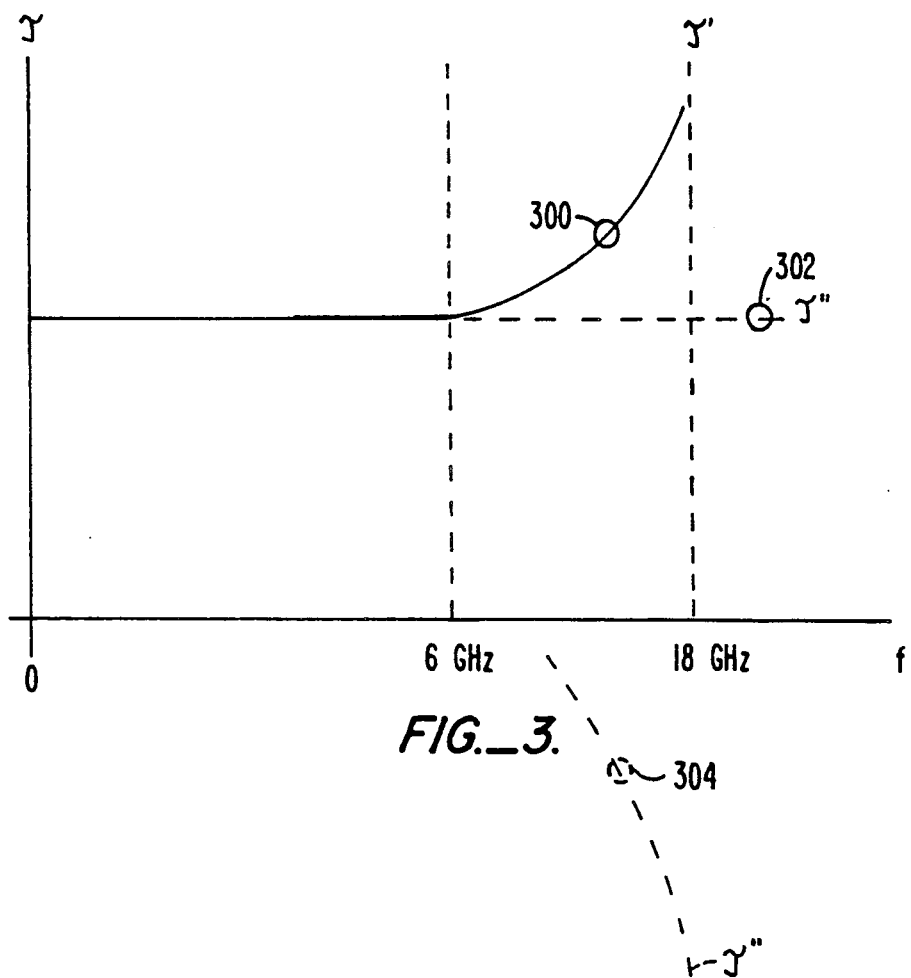

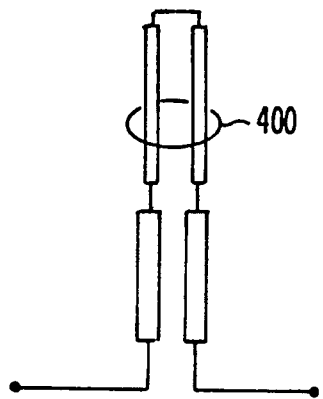
FIG._4A.
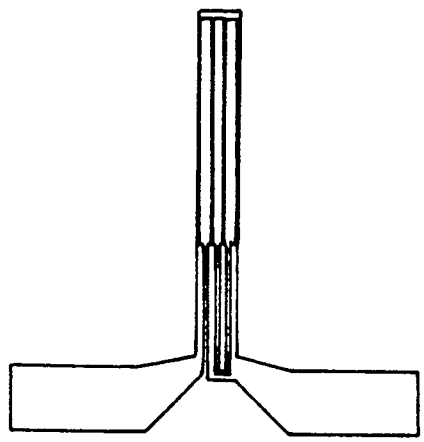
FIG._4C.
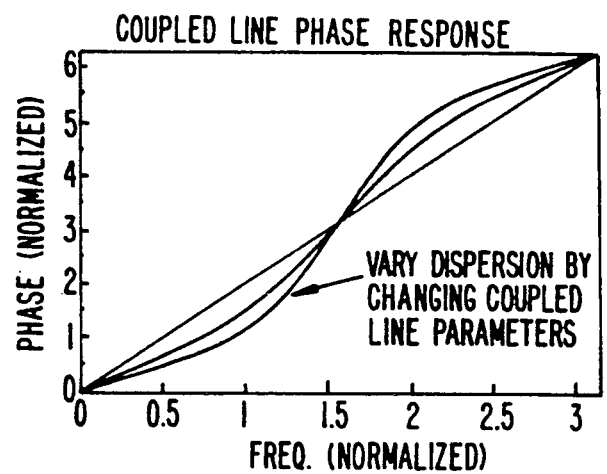
FIG._4B.

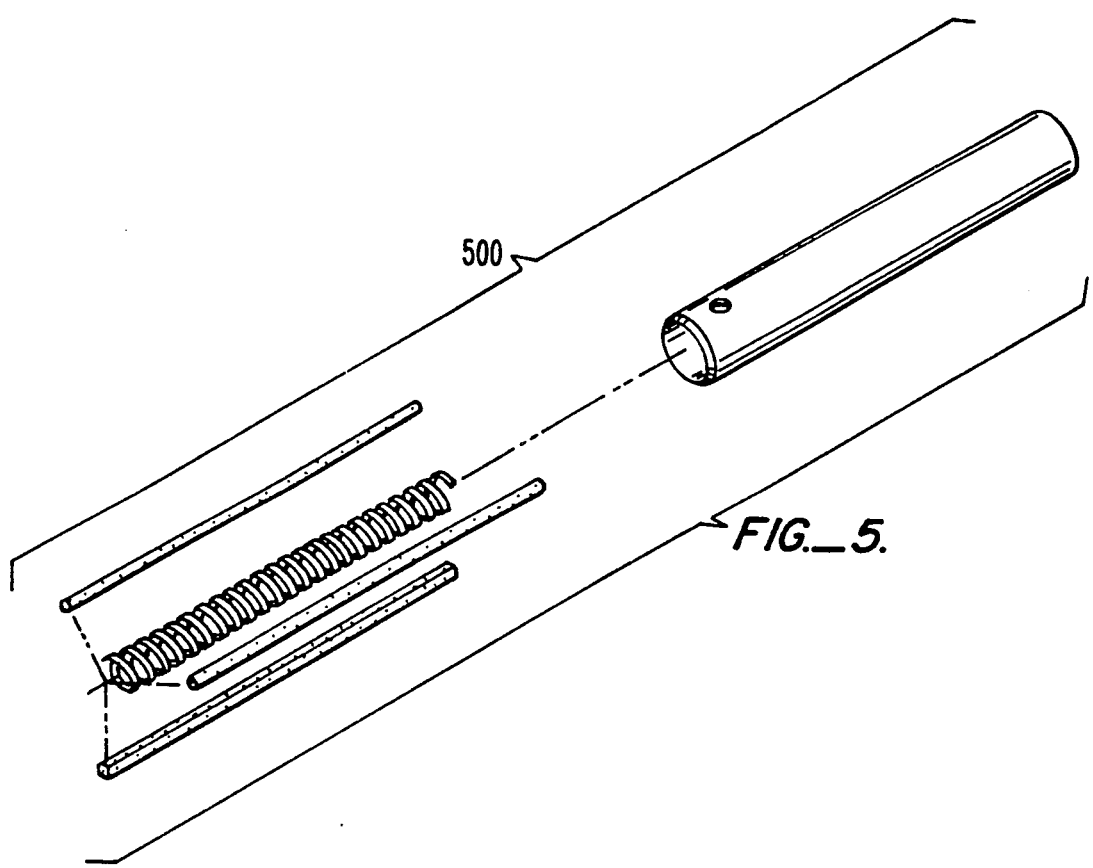
FIG._5.

FEED-FORWARD AMPLIFIER INCLUDING PHASE CORRECTION

BACKGROUND OF THE INVENTION

1. Field of the Invention

The present invention relates generally to microwave amplifiers and, more particularly, relates to a microwave amplifier utilizing a feed-forward technique.

2. Brief Description of the Relevant Art

Feed-forward is a standard distortion cancellation technique which is very effective for removing distortion from an amplified signal. When a microwave input signal is amplified the amplitude of the input signal is increased by a factor equal to the gain of the amplifier. The output signal of the amplifier includes a component representing the amplified input signal and a distortion component that is not a true representation of the input signal.

In a feed-forward system this distortion component is sampled, amplitude matched to the distortion component of the amplifier output signal, and recombined 180° out of phase with the amplitude output signal to cancel the distortion component in the amplitude output signal.

Complete cancellation requires that the sampled distortion signal be exactly 180° out of phase with the distortion component of the amplifier output signal. In the feed-forward system this phase relationship is achieved by introducing fixed delay into the signals. Thus, the attainment of the required phase relationship depends on the accuracy of magnitudes of the introduced delays.

The phase error caused by a delay error of a fixed magnitude increases as the frequency of the signal increases. Thus, accuracy limitations imposed by the physical embodiment of a delay line and amplifier elements have limited the use of the feed-forward technique to applications below some threshold frequency.

Additionally, delay matching requires that the delay introduced by the amplifier components of the system be of fixed amplitude. However, for signals in the gigahertz (GHz) range amplifiers exhibit phase dispersion and the delay introduced into each frequency component of the amplifier input signal is not constant.

Thus, the required phase relationship may not be obtained for different frequency components of a broadband input signal regardless of the accuracy obtainable by the circuit delay elements.

Accordingly, the utilization of the feed-forward technique has not been possible for broadband input signals in the GHz range.

SUMMARY OF THE INVENTION

The present invention is technique to compensate for the effects of frequency dispersion in the feed-forward amplifier so that the error correction technique can be used for a high-frequency, broadband input signal.

According to one aspect of the invention, phase compensation elements are placed in each loop to cancel the change in delay at high frequencies introduced by the main and error amplifiers.

According to another aspect of the invention, a first phase compensation element in the first loop is placed before the main amplifier so that the gain of the main amplifier is not degraded.

According to a further aspect of the invention, a second phase compensation elements is place at the output of the error amp so that the loss introduced by the second element does not appear as noise in the loop.

Other advantages and features of the invention will become apparent in view of the drawings and following detailed description.

BRIEF DESCRIPTION OF THE DRAWINGS

FIG. 1 is a schematic diagram of a preferred embodiment of the invention;

FIG. 2 is a graph depicting two frequency components;

FIG. 3 is a graph depicting the delay as a function of frequency for the amplifiers, linear delay elements, and phase compensation elements;

FIG. 4A is a schematic diagram of a cascaded coupled line section;

FIG. 4B is a schematic diagram of the dependence of phase-shift on frequency for the coupled line section;

FIG. 4C is a schematic diagram of a thin-film embodiment of the phase compensation element; and FIG. 5 is a schematic diagram of a dispersive delay element.

DETAILED DESCRIPTION OF THE PREFERRED EMBODIMENTS

FIG. 1 is a block diagram of a preferred embodiment. In FIG. 1 a feed-forward amplifier includes first and second loops 10 and 12. The first loop 10 includes in input power divider 20 having an input port for receiving an input signal and first and second output ports. The first output port is coupled to a first output signal coupler 24, which has one input port and first and second output ports, via a first phase compensation element 28 and a main amplifier 30. The second output port of the input power divider 20 is coupled to a first input port of a second output signal coupler 34, which has first and second input ports and an output port, via a first linear delay element 38. The second input port of the second output signal coupler 34 is coupled to the second input port of the first output signal coupler 24 by an attenuation element 42. The second loop 12 includes a second output power divider 50 having a first input port coupled to the output port of the second output signal coupler 34 via an error amplifier 54 and a second phase compensation element 58 and having a second input port coupled to the output port of the first output signal coupler 34 via a second linear delay element 62. The output port of the second output power divider 50 provides the output signal of the feed-forward amplifier.

The operation of the system depicted in FIG. 1 will now be described. The function of the first loop 10 is to isolate the distortion component of the amplified signal. This function will first be described without considering the effect of the first phase compensation element 28.

The input power divider 20 samples an input signal and couples a portion of its power to the main amplifier 30. The main amplifier 30 amplifies this portion of the signal to form an amplified input signal. This signal includes an amplified signal component having an amplitude equal to G, where G is the gain of amplifier, multiplied by the amplitude of the input signal coupled to the main amplifier input. It also includes a distortion component that does not represent the magnitude of the input signal but is due to non-linearities in the main amplifier and other effects. At low frequencies, the amplified signal component is phase shifted from the input signal by a fixed phase shift due to a fixed signal delay introduced by the amplifier.

The delay element 38 introduces a delay into the coupled input signal that matches the fixed delay introduced by the main amplifier 30. This delayed input signal and an attenuated version of the amplified input signal are coupled at the first output signal coupler 24.

The first coupler 24, attenuation element 42, and second coupler 24 attenuate the amplitude of the amplified signal component by an factor that cancels the gain of the amplifier. The distortion component is attenuated by the same factor. Thus, the absolute value of the magnitude of the attenuated amplified signal component that is coupled to the delayed input signal at the second signal coupler 34 is closely matched to the magnitude of the delayed signal. Additionally, the delays introduced by the first coupler 24, attenuation element 42, and second coupler 34 introduce a 180° phase-shift into the attenuated amplified input signal so that the delayed input signal and attenuated amplified input signal cancel at the second signal coupler 34 to isolate an attenuated, phase-shifted distortion component which is output as an error signal at the output port of the second signal coupler 34. The isolated distortion component has also been phase-shifted 180° relative to the distortion component output by the main amplifier 30.

The function of the second loop is to match the amplitude of the isolated distortion component to the distortion component of the main amplifier output and to cancel this distortion component from the amplified input signal formed by the main amplifier 30.

The isolated distortion signal is amplified by the error amplifier 54 to form an amplified error signal. The gain of the error amplifier is equal to G to cancel the attenuation introduced into the distortion component of the amplified input signal and to match the amplitude of the error signal to the amplitude of the distortion component of the amplified input signal. The error amplifier 54 also introduces a fixed delay at low frequencies. The second delay element 62 introduces a delay equal in amplitude to the fixed delay of the error amplifier into the amplified input signal to form a delayed amplified input signal. Thus, when the error signal and delayed amplified input signal are combined at the output signal coupler 50 the absolute values of the magnitudes of the error signal and distortion component of the delayed amplified input signal have the same amplitude. Additionally, since a 180° phase shift was introduced into the error signal, the error signal cancels the distortion component of the amplified input signal and a clean amplified input signal is provided at the output of the feedforward amplifier.

FIG. 2 schematically depicts a single frequency component of the input signal 200 and delayed amplified output signal 202 and illustrates the relationship between phase and delay. The period of the component is T seconds, the frequency, f, is 1/T, and amplitude of the delay introduced into the amplified output signal is D seconds. The phase difference (DP) between the two signals is:

DP=(D/T) 360°.  Eq. 1

For very high frequencies Eq. 1 predicts a very large phase matching error between the two signals 200 and 202 for a very small difference in the delays introduced by the linear delay elements 38 and 62 and the main amp and error amp 30 and 54. For example, for an 18 Gigahertz (GHz) harmonic an 1 picosecond error between the delay of a delay element and amplifier causes an 10° error in phase matching.

As described above, signal cancellation between the delayed input signal and amplified input signal requires that the relative phase difference be 180° so that the peaks of one signal overlap the valleys of the other signal. Accordingly, for signals in the GHz range the fixed delays introduced by the amplifiers 30 and 54 and the delay elements must be precisely controlled. In the preferred embodiment, monolithic microwave integrated circuits (MMICs) are utilized as amplifiers and coaxial delay lines are utilized as delay elements. The MMICs are characterized by uniform delay and dispersion functions and the delay lines provide a constant delay over a wide frequency range.

FIG. 3 is a graph depicting the dependence of the delay on frequency. In FIG. 3, the solid curve 300 depicts the delay/frequency relationship of the amplifiers 30 and 54, the dashed line curve depicts the delay/frequency relationship for the linear delay elements 38 and 62, and the dotted line curve 304 depicts the delay/frequency relationship for the phase compensation elements 28 and 58.

In the microwave frequency range the amplifier exhibits phase dispersion and the magnitude of delay increases with frequency. This increasing delay causes the total deviation from linear phase to approach 90° in this frequency range. The delay introduced by the linear delay elements remains constant for all frequencies. Accordingly, signal cancellation is almost complete for low frequencies because the delays introduced by the amplifiers 30 and 54 and linear delay elements 38 and 62 for all frequency components can be precisely matched and a fixed delay is introduced by the phase compensation elements 28 and 58.

At high frequencies the delay introduced for each harmonic is different for the amplifiers 30 and 54 and the linear delay elements 38 and 62. Thus, according to Eq. 1, the phases shifts between the harmonics will vary and signal cancellation in the loops 10 and 12 will not be complete.

The phase compensation elements 28 and 58 introduce a fixed delay at low frequencies. At low frequencies, the sum of the fixed delays introduced by the amplifier 30 or 54 and the coupled phase compensation element 28 or 58 are equal to the fixed delay introduced by the corresponding linear delay element 38 or 62 so that the cancellation due to the linear delay elements 38 and 62 is not affected. However, at high frequencies the shape of the delay curve 304 of the phase compensation elements 28 and 58 is the mirror image of the dispersion curve 300 of the amplifiers 30 and 54. At a given high frequency the delay introduced by the phase compensation element 28 or 58 decreases by the same amount that the delay introduced by the amplifier 30 or 54 increases. Thus, the sum of the delays introduced by the frequency compensation element 28 or 58 and amplifier 30 or 54 in each loop 10 or 12 introduces a delay equal to that of the linear phase element 38 or 62 so that nearly complete signal cancellation takes place at the couplers 34 or 50.

Another feature of the invention is the placement of the frequency compensation elements 28 or 58 relative to the amplifiers 30 and 54. In the first loop 10 it is critical that the power gain of the input signal be as large, possible. Because the phase compensation elements are lossy, placement of the first phase compensation element 28 after the main amp 30 would lower the signal power and degrade the signal quality. Therefore, in the first loop the phase compensation element is placed before the main amp 30.

In the second loop 12, the phase compensation element 58 is placed after the error amp 54 because loss due to the phase compensation element would appear as noise that would not get cancelled in the second loop 12.

In one embodiment of the invention the phase compensation element is comprised of a cascaded couple line section 400 as shown in FIG. 4A. This element produces a phase response as shown in FIG. 4B. The portion of the curve over which the circuit operates is selected by varying the length of the coupled sections, and is chosen such that it compensates the phase error of the amplifier. An example is shown in FIG. 3, curve 304. The curves in FIG. 4B may be shifted frequency by adjusting the length and coupling factor of the coupled line section 400. Alternatively, a thin film circuit layout 402 as depicted in FIG. 4C can be utilized. Multiple coupled lines increase the coupling factor and two sections are cascaded to increase the overall dispersion. The final configuration is obtained by simulating using Touchstone ®, a commercial linear circuit simulator.

A second embodiment of the invention uses dispersive delay lines as the delay elements 38 and 62. These delay lines match the phase characteristic of the amplifiers, therefore eliminating the need for phase compensation elements 28 and 58. This delay is achieved by adapting the slow wave helix structure 500 from a traveling wave tube as depicted in FIG. 5. These helices can be designed for a particular phase characteristic by adjusting the pitch of the helix and separation from the tube and are very low loss.

The amplitude of the dynamic range (DR) of the system is determined by the following relationship:

$$DR = TN - G - NF - IMP - BW \qquad \text{Eq. 2}$$

where TN is the thermal noise, G is the magnitude of amplifier gain, NF is a noise factor, IMP is a distortion factor, and BW is the bandwidth. Since the present invention reduces the distortion factor (IMP) the amplitude of the dynamic range of the amplifier in increased. Accordingly, an amplifier having a large bandwidth and dynamic range has been realized that functions in the extremely high 6-18 GHz frequency range.

In applications where the amplitude and frequency of a signal are unknown such large bandwidth and dynamic range a critical features of an amplifier in a system designed to detect the unknown signal. The invention is useful for frequency bands covering 10% bandwidths up to 3:1 bands, with frequencies as high as 18 GHz.

What is claimed is:

1. In a feed-forward amplifier for receiving an input signal and having a first loop, including a main amplifier that receives a first part of the input signal and generates a first amplified output signal, with the first loop for providing the first amplified output signal and an isolated distortion component of the first amplified output signal and having a second loop, including an error amplifier that receives a difference signal as an input and generates a second amplified output signal, with the second loop for subtracting the isolated distortion component from the first amplified output signal to produce the difference signal to produce an amplified output signal having very low distortion, with said main and error amplifiers characterized by a non-linear delay dispersion curve that indicates the magnitude, being the absolute value and sign, of the delay introduced by the amplifier between each frequency component in the input signal received by the amplifier and the same frequency component in the amplifier output signal for each frequency in a predetermined broadband operating range, a system for compensating the fixed delay introduced by the amplifiers at low frequencies and for the non-linear frequency dependent delay introduced by the amplifiers at high frequencies in said predetermined operating range, said system comprising:

first means, having an input coupled to receive the first part of the input signal and an output coupled to said main amplifier, for introducing a delay into each frequency component of the first part of the input signal, with the magnitude of the introduced delay having an absolute value substantially equal to the absolute value of the delay indicated by the non-linear delay dispersion curve for each frequency in said predetermined range but having the opposite sign; and second means, having an input coupled to said error amplifier, for introducing a delay into each frequency component of the second amplified signal, with the magnitude of the introduced delay having an absolute value substantially equal to the absolute value of the delay indicated by the non-linear delay dispersion curve for each frequency in said predetermined range but having an opposite sign.

2. The system of claim 1 wherein said first means comprises:

a cascaded coupled line section.

3. The system of claim 1 wherein said first means comprises:

a slow wave helix structure.

4. In a feed-forward amplifier for receiving an input signal and having a first loop, including a main amplifier that receives a first part of the input signal and generates a first amplified output signal, with the first loop for providing the first amplified output signal and an isolated distortion component of the first amplified output signal and having a second loop, including an error amplifier that receives a difference signal as an input and generates a second amplified output signal, with the second loop for subtracting the isolated distortion component from the first amplified output signal to produce the difference signal and to produce an amplified output signal having very low distortion, with said main and error amplifiers characterized by a non-linear delay dispersion curve that indicates the magnitude, being the absolute value and sign, of the delay introduced by the amplifier between each frequency component in the input signal received by the amplifier and the same frequency component in the amplifier output signal for each frequency in a predetermined broadband operating range, a system for compensating the fixed delay introduced by the amplifiers at low frequencies and for the non-linear frequency dependent delay introduced by the amplifiers at high frequencies in said predetermined operating range, said system comprising:

a first linear delay element, disposed in said first loop, having an input for receiving a second part of the input signal, and having an output for providing a delayed input signal, for introducing a fixed delay in all frequency components of the received second part of the input signal, with the magnitude of the fixed delay equal to the magnitude of the fixed delay introduced by the main amplifier at low frequencies;

a first passive phase compensation element coupling the input of the main amplifier to the first part of the input signal for introducing a delay into each frequency component of the first part of the input signal, with the magnitude of the introduced delay having an absolute value substantially equal to the absolute value of the delay indicated by the non-linear delay dispersion curve for each frequency in said predetermined range but having the opposite sign so that delay of the first amplified output signal relative to the input signal is substantially frequency independent at high frequencies in the predetermined operating range;

a second passive phase compensation element coupled to the output of the error amplifier for introducing a delay into each frequency component of the second amplified output signal, with the magnitude of the introduced delay having an absolute value substantially equal to the absolute value of the delay indicated by the non-linear delay dispersion curve for each frequency in said predetermined range but having an opposite sign; and a second delay element, disposed in said second loop, having an input for receiving the first amplified output signal, and having an output for providing a delayed first amplified output signal, that introduces a fixed delay for all frequencies with the magnitude of the fixed delay equal to the magnitude of the fixed delay introduced by the error amplifier and second phase compensation element at low frequencies.

5. A high-frequency amplifier including a first loop comprising:

an input power divider, having an input port and first and second output ports, for sampling an input signal received at the input port and coupling parts of the sampled signal to the first and second output ports;

a first passive phase compensation element coupled to said first output port for introducing a different predetermined frequency dependent delay, at each high frequency in a predetermined operating range of frequencies, into said coupled input signal to form a phase compensated input signal, where the magnitude, being the absolute value and sign, of the introduced delay for each frequency is a non-linear dispersion function of frequency and the sign of the change of the delay introduced at a given high frequency indicates whether the magnitude of the delay is increased or decreased;

a main amplifier, coupled to said first phase compensation element, for amplifying said phase compensated input signal to form an amplified phase compensated input signal, with the main amplifier characterized by a fixed gain, by a fixed frequency independent delay at low frequencies, and that introduces a frequency dependent delay, at each high frequency in the predetermined operating range, into the amplified input signal with the magnitude of the frequency dependent delay introduced by the amplifier at each high frequency being substantially equal in absolute value to but of opposite sign to the magnitude of the frequency dependent delay introduced by said first phase compensation element so that magnitude of the delay introduced into the amplified phase compensated input signal is substantially frequency independent;

a first output signal coupler, having an input port for receiving said amplified phase compensated input signal and first and second output ports, for coupling the amplified phase compensated input signal to the first and second output ports of the first output signal coupler, where the first output coupler also attenuates the signals coupled;

a first linear delay element coupled to said second output port of said input power divider for delaying said coupled input signal by a fixed delay substantially equal to said fixed frequency independent delay of said main amplifier to form a delayed input signal;

a second output signal coupler, having a first input port coupled to said first linear delay element, a second input port coupled to the second output port of said first output signal coupler, and an output port, for receiving and coupling the amplified phase compensated input signal and said delayed input signal to form an error signal being the attenuated distortion part of the amplified phase compensated input signal;

with amplifier further including a second loop comprising:

an error amplifier, coupled to said second output signal coupler, for amplifying said error signal to form an amplified error signal with said error amplifier characterized by a fixed gain, by a fixed frequency independent delay at low frequencies, and that introduces a frequency dependent delay at each high frequency, in a second predetermined operating range of frequencies, into the amplified input signal, where the magnitude of the delay introduced by the error amplifier is a non-linear dispersion function of frequency;

a second passive phase compensation element coupled to said error amplifier for introducing a frequency dependent delay at each high frequency in the second operating range into said amplified error signal, with the magnitude of the frequency dependent delay introduced by the second phase compensation element at each high frequency in the second operating range having an absolute value being substantially equal to but of opposite sign to the magnitude of the frequency dependent delay introduced by said error amplifier so that magnitude of the delay introduced into the amplified phase compensated error signal is substantially frequency independent;

a second linear delay element coupled to said first output port of said first output power divider for delaying said coupled amplified phase compensated input signal by a fixed delay substantially equal to said fixed frequency independent delay of said error amplifier to form a delayed amplified phase compensated input signal; and a third output signal coupler for combining said amplified phase compensated error signal and said delayed amplified phase compensated input signal to substantially cancel the distortion part of said delayed amplified phase compensated input signal thereby forming an amplified output signal having a small distortion component.

* * * * *